July 2, 1929. W. G. CADY Re. 17,355

PIEZO ELECTRIC RESONATOR

Original Filed Jan. 28, 1920

INVENTOR.
WALTER G. CADY by David Rines
ATTORNEY.

Reissued July 2, 1929. Re. 17,355

UNITED STATES PATENT OFFICE.

WALTER G. CADY, OF MIDDLETOWN, CONNECTICUT, ASSIGNOR TO RADIO CORPORATION OF AMERICA, A CORPORATION OF DELAWARE.

PIEZO-ELECTRIC RESONATOR.

Original No. 1,450,246, dated April 3, 1923, Serial No. 354,659, filed January 28, 1920. Application for reissue filed April 2, 1925. Serial No. 20,277.

DIVISION A.

For many years it has been known that quartz, tourmaline and certain other crystals, if compressed or otherwise strained in certain directions, respond electrically, so as to exhibit positive and negative electrification in certain regions on their surfaces. It has also been known that the converse effect obtains, that is to say, that such crystals, when electrically stimulated, as by being placed in an electric field, become deformed. This phenomenon has been known as piezo-electricity. In the specification and the claims, the action of the electric forces to cause mechanical deformation will, for brevity, be called "stimulation"; and the development of the electromotive force by the deformation will be called "response". A large number of both natural and artificial crystals have been found to possess this piezo-electric property. The general knowledge on the subject has so far developed that it is now possible to predict in advance whether a given crystal will show the piezo-electric effect, and in what manner a plate or rod should be cut from the crystal in order to exhibit this effect to the greatest possible degree.

The crystal that has been most commonly employed in piezo-electric experiments, in the past, has been quartz. As a rule, investigators have used thin, flat plates or rods of quartz rectangular in cross section, and coated on their opposite faces with tinfoil. These plates or rods have been so cut from the crystal that the direction of their length has been perpendicular to the optical axis and to one of the binary or electrical axes of the crystal; the direction of their breadth, parallel to the optical axis; and the direction of their thickness parallel to the said electrical axis. A more complete description may be found in my paper in the Proceedings of the Institute of Radio Engineers, vol. 10, April, 1922, beginning on page 83, and more particularly at page 85. When such a plate or rod is placed in an electric field perpendicular to its flat faces, or parallel to the direction of the thickness of the plate, as, for example, between two oppositely charged sheets of tinfoil or other metal coatings, it tends to become deformed. It tends to become elongated or shortened in a direction perpendicular to the electric field, and parallel to its length; and the thickness of the plate tends to become decreased or increased in a direction parallel to the electric field. Whether the resulting deformation of the plate is an elongation or a shortening in its length, or a decrease or increase in its thickness, depends upon the polarity of the electric field. These two piezo-electric deformations of the quartz plate, in directions perpendicular and parallel to the electric field have been known in the prior art under the terms "transverse" and "longitudinal" effects respectively. When such plates are mechanically deformed, on the other hand, as when they are compressed endwise, one of the metal coatings becomes charged positively, and the other negatively, the signs of the charges having a definite relation to the principal axes of the crystal from which the plate is cut.

More recently, investigators, including myself, have experimented on the effects produced when the crystal plates, instead of being charged statically, are subjected to alternating electric fields of various frequencies. Nicolson, for example, has published a paper on the use of Rochelle-salt crystals as receivers and transmitters in telephony. Following this line of investigation, I have conducted experiments with different crystals exposed to the effect of higher frequencies, such as are used in radio-telegraphy, and have studied, particularly, the periodic lengthening and shortening of rectangular plates when the coatings were connected to a source of high-frequency electro-motive force; and the invention upon which this application for Letters Patent is based has been the result of this study and the information obtained from such experiments.

It is evident that a crystal plate, with conductive coatings, as above described, constitutes a true electric condenser, and possesses a certain electrostatic capacity. I have observed that the capacity and the resistance of such a plate varied under different circumstances, and for this I have ascertained the cause and developed the mathematical theory.

My experiments have included both the transverse and the longitudinal effects. As was mentioned in my Patent No. 1,472,583, granted October 30, 1923, it will be more convenient to explain and describe the invention in terms of the transverse effect; but the explanations and descriptions apply equally well to piezo-electric crystals, or portions or preparations thereof, in which the longitudinal effect or any other type of piezo-electric deformation is utilized. The plate or rod may, for example, be so designed and mounted as to permit taking advantage of the principle of flexural vibrations. Not all crystals have both the longitudinal and the transverse deformations. Rochelle salt, for example, belongs to a crystal class such that the longitudinal effect is absent.

The phenomenon may be thus briefly explained in terms of a transverse effect. A rectangular plate, like any elastic solid, is capable of being set into longitudinl vibrations. If suddenly struck on one end, the vibrations are free and of a frequency dependent essentially upon the elastic modulus, the density of the material of which the plates is composed, and the length of the plate. The equation for such longitudinal vibrations is well known and may be found on page 89, line 2, of my said paper. This periodic elongation and contraction of the piezo-electric plate will, as explained above, cause periodic positive and negative charges, at the same frequency, to appear on the metal coatings, thus giving use to an alternating electromotive force which may be observed and utilized in various ways.

If, however, the vibrations are impressed on the plate by some outside agency, as occurs in these piezo-electric experiments, they are said to be forced, as distinguished from free. The amplitude of such forced vibrations is exceedingly minute, except when the frequency of the impressed force approximates the natural frequency of the plate, or, in other words, that of the free vibrations. If, for example, the impressed frequency is gradually raised from one less than the natural to one higher, the amplitude of vibration will be at first small, will rise to a large value as the resonant frequency is reached and will then fall again.

In further illustration, assume a plate of piezo-electric crystal having, on its opposite faces, tinfoil coatings connected to a source of high-frequency electromotive force. As the plate vibrates, its length increases and diminishes alternately, and although such changes in length are so minute as to escape detection under ordinary conditions they are sufficient to exert a marked reaction upon the electric current. The current is modified by this reaction both in phase and amount. The reaction is of two kinds—assuming the source of electromotive force to be constant—first: a capacity reaction such that, on slowly increasing the frequency, the apparent parallel capacity of the plate passes through a maximum at a frequency slightly below resonance, followed at a frequency slightly above resonance, by a minimum so low that the aparent parallel capacity actually becomes negative, and returning to the normal, positive value as the frequency is further increased; and second, a resistance reaction, such that, owing to the absorption of energy from the circuit when the plate is vibrating, the apparent parallel resistance, which normally is practically infinite, reaches a sharp minimum at the resonant frequency. The frequency at which the reaction takes place depends chiefly upon the length of the plate, and the intensity of the reaction depends under ordinary circumstances, directly upon its width and inversely upon its thickness, in accordance with well known piezo-electric, mathematical equations. It is this reaction that I utilize in my invention.

If the crystal plate is connected to a source of constant alternating voltage, an ammeter connected in series with the coatings will be found to pass through a maximum at a frequency slightly below the resonant frequency, followed by a minimum at a frequency slightly above the resonant frequency. A somewhat different result may be obtained by connecting the coatings in parallel with the capacity and the self-inductance of a tuned electric circuit, assuming still that the electromotive force impressed on the coil is of constant magnitude, but variable frequency. The current flowing to the coatings will, as in the previous case, pass through a maximum, followed by a minimum, as the frequency increases; but if the resistance of the circuit falls within certain limits, such as are quite commonly employed, in practice, a secondary maximum and a secondary minimum will be found, lying between the first-named maximum and minimum. It is unnecessary, for the present purpose, to explain the theory of these reactions, as it is fully explained in my above-referred-to paper in the Proceeding of the Institute of Radio Engineers, with particular reference to the curves I and *i* in Fig. 6, page 101.

When the plate is made from a piezo-electric crystal of good elastic qualities, such as quartz, when its width is small in comparison with its length, and it is mounted in such manner that its vibrations will be damped as little as possible, the reaction is extremely sharp and very pronounced. Such a plate, connected to a source of electric oscillations of variable frequency, will respond when one and only one frequency—neglecting for the moment overtones—is being generated. It forms a piezo-electric resonator, somewhat analogous to the acoustical resonators of Helmholtz. If the natural frequency of the plate has been determined by comparison with a standard wave-meter, or otherwise, it may be, in turn, used as a standard for calibrating radio and other high-frequency circuits, and a number of such plates, of different lengths, may be used for calibrating a high-frequency circuit over as wide a range as desired.

It is not necessary that the device comprise a long, narrow plate, although this has its advantages in permitting greater sharpness of tuning, and in securing greater freedom from effects that might be produced by undesired modes of vibration. The plate may have various shapes, or some other form than a plate may be used, including the entire native crystal itself. In fact, it is within the scope of the present invention to use other electro-mechanical vibrators than piezo-electric crystals. The only essential condition is that the vibrator shall be mounted and connected to an oscillating circuit of variable frequency in such a manner as to react electrically upon such circuit at a particular frequency. In general, the more complicated the form, the more numerous are the frequencies to which the unit will respond.

In the accompanying drawings, I have illustrated graphically the nature of my invention and various ways of modifying the same and applying it to practical use; and to these drawings I now refer.

Figs. 3 to 8, inclusive, are diagrams illustrating uses and applications of the invention which will be described in detail.

Figure 1:
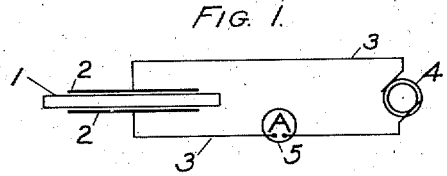
Fig. 1 is a diagrammatic illustration of the instrument in its simplest form.

In Fig. 1, the piezo-electric plate is designated by the numeral 1. The conductive coatings 2 are connected with a source of high-frequency current 4 by wires 3 and an ammeter 5 is shown in this circuit.

If the frequency be increased, the current traversing the circuit, as measured by the ammeter 5, will be found to pass through a maximum at a frequency slightly below the resonant frequency, followed by a minimum at a frequency slightly above the resonant frequency. If the frequency be decreased, this process will be reversed. This is true, irrespective of the nature of source 4, whether a vacuum tube, or of some other character, assuming, however, that the source is of constant, alternating voltage. If a vacuum-tube generator, with the usual associated circuits, is used as the source of voltage, a distinction must be made according to whether the crystal is connected directly in the generating circuit, or in a secondary circuit, in which latter case, the source 4, in Fig. 1, might be a coil in which electromotive force is induced from the generating circuit. This latter case is further discussed below. The reactions of the crystal are such that, with a tube-generating circuit, as commonly employed, it is usually impossible to make the circuit oscillate at exactly the natural frequency of vibration of the crystal when the crystal is connected directly in the circuit, but the frequency at which the above-mentioned minimum occurs is so close to the natural frequency that, for most practical purposes, it may be regarded as the natural frequency of the crystal. These results follow readily from Fig. 11 of my before-mentioned paper and actually do occur, in practice.

Figure 2:
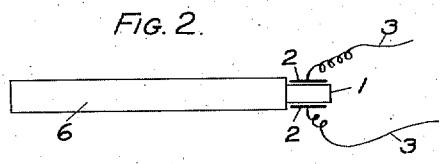
Fig. 2 shows, in a similar manner, a modification of the same.

In Fig. 2, a modification of this instrument is shown. When the desired frequency is relatively low, crystals of sufficient size may not be economically secured, in which case, I use a thin rod 6 of any solid substance of good, elastic properties, for example, steel, as the vibrating element. It should be of such length that its natural period of vibration, calculable from the well known equation, is of the desired value. This rod is set into vibration by means of a piezo-electric plate 1 of relatively small dimensions, cemented or otherwise held in intimate contact with it. The shape, size and material of the plate 1 should be such as to excite as strong, longitudinal vibration in the rod 6 as possible, when the metallic coatings 2 are connected to a source of high-frequency electro-motive force, but, in any event, it should be small enough so that none of its own modes of vibration, to which it may be piezo-electrically excited, are of a frequency sufficiently near the natural frequency of the rod 6 to be troublesome. The natural frequency of the rod 6, is, of course, slightly modified by the plate 1 attached thereto, but the combination of the two forms a unit of very constant frequency, capable of reacting sharply on a high-frequency circuit in exactly the same manner as the plates when used alone, as in the preceding figure.

It is not, of course, essential that the exciting plate of piezo-electric crystal be attached to the rod 6 at the end of the latter. A piezo-electric plate or plates may, for example, be cemented to one or both sides of the rod 6, preferably at the center of the rod 6. Nor is it entirely essential that the piezo-electric body so attached be in the form of a plate.

The rod 6 should be of such material that its natural frequency is as slightly as possible affected by changes of temperature, but, in any case, correction may readily be made for this. It need not be of solid material,—though solid materials will probably be found best,—for it is possible to use, in place of a solid, a column of liquid, for example, mercury, in a long narrow tube, one end of the column being in contact with the piezo-electric plate or crystal. One advantage of this arrangement is the possibility of varying the frequency of vibration at will, by adjustment of the length of the column of fluid.

Figure 3:
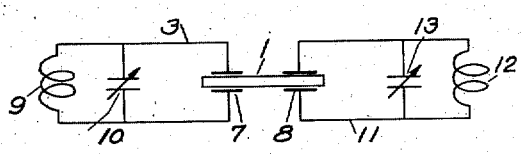

The piezo-electric resonator may be used in various ways, as, for example, to produce a large impedance or reactance in an alternating circuit at a certain particular frequency or frequencies, to serve as a standard of frequency or wave length in high-frequency circuits, or, even, for such purposes as coupling one high-frequency circuit to another, in order to transmit energy from one to the other circuit at a certain particular frequency. This latter application of the invention is shown in Fig. 3. In this Figure 1 is the piezo-electric resonator, having two pairs of coatings 7 and 8, one pair 7 of which is connected to the oscillating circuit 3, which contains also a coil 9 and a condenser 10, while the other pair of coatings 8 is connected to a similar oscillating circuit 11 containing a coil 12 and a condenser 13. The figure is intended merely to illustrate the general principles which apply to any of the numerous types of high-frequency circuit.

Figure 5:
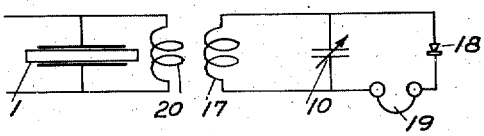
Figure 6:
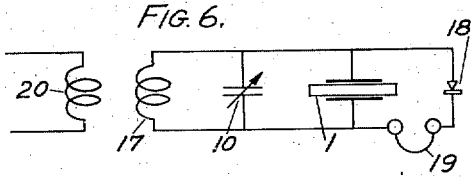
Figure 8:
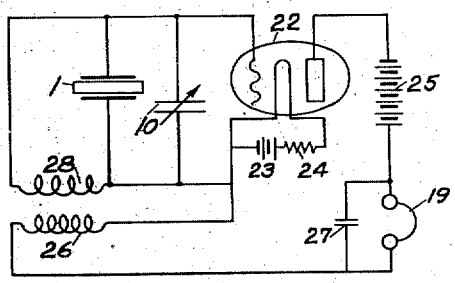

In this case, the following action takes place: Assuming that 3 represents the primary circuit, then, whenever an alternating current, at the critical frequency, flows in that circuit, the plate 1 will be brought into energetic vibration through the agency of the alternating potential differences between the coatings 7. These vibrations, will, in turn, generate potential differences in the coatings 8, which will cause an alternating current of the same frequency to flow in the secondary circuit 11. At other frequencies, the forced vibrations in the resonator 1 will be of very small amplitude, hence the induced current will be correspondingly small. The current flowing in the coil 12, at the frequency of the crystal, may be detected in any desired way, as by means of a telephone receiver 19, as shown in Figs. 5, 6 and 8, or it may be otherwise utilized.

Figure 4:
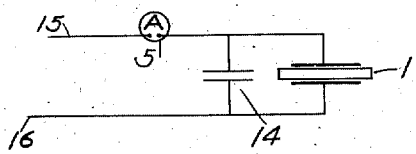

When it is desired to reduce the current in a high-frequency circuit to as low a value as possible, at a critical frequency, the arrangement shown in Fig. 4 may be employed. In this figure, the piezo-electric resonator 1 is connected in parallel with a condenser 14, which may form part of any tuned oscillatory circuit in which alternating current of variable frequency is flowing. The wires 15 and 16 connect the condenser 14 with the remainder of the circuit, through an ammeter 5. At a critical frequency, the absorption of energy in the piezo-electric resonator causes the current in the ammeter to pass through a minimum. This decrease in current is the greater, the smaller the capacity of the condenser with respect to that of the resonator.

As has been explained above, the current flowing to the crystal body does not sink to a simple minimum at resonance, but as the frequency is increased, it passes through a maximum, followed by a minimum, with a possible secondary maximum and minimum lying in-between. For this reason, when it is desired to reduce a current to a minimum at a predetermined frequency, the current in question should be either that through the ammeter 5 in Fig. 4, or else that flowing to condenser 14 in the same figure, since in the latter case the current falls in general to a simple minimum at resonance. Similarly, in Fig. 7, the current passes through a minimum at resonance in the ammeter 21, and also in the condenser 10. This is explained in my said paper in the Proceedings of the Institute of Radio Engineers, pages 99 to 101.

This circuit constitutes a piezo-electric filtering circuit, and, as is well known to be the case with all narrow-band filtering circuits, it is an advantage to have the electrical resistance as low as possible.

This figure also indicates one way in which the piezo-electric resonator may be made to serve as a standard of frequency or of wave length in radio-telegraphy. It is only necessary to connect several such resonators, in succession, in place of that shown, each time making note of the readings of the condenser or other apparatus at the critical frequency.

A resonator, when used as a frequency standard, should not be connected in series with the oscillating circuit, since its capacity is so small that it would destroy the tuning. It is usually connected in parallel with the tuning condenser. The alternating current traversing the circuit thus divides, part passing through the condenser 14 and the remainder through the crystal 1. The effect of the crystal upon the tuning is then slight. Such effect as it has upon the tuning may be further reduced by connecting a very small capacity, of a few micro-micro-farads, in series with the resonator. Often the response is sufficiently strong, even when one or both of the terminals of the resonator is entirely disconnected, the capacities between the resonator terminals and the circuit being sufficient to effect a perceptible response. By means of these capacities, the resonator is enabled to absorb enough energy to make it vibrate and to react perceptibly upon the circuit.

In Fig. 5, the piezo-electric resonator 1 forms part of an oscillatory circuit loosely coupled to a tuned circuit comprising a coil 17 and a condenser 10. In parallel with the latter, is a detector 18 and a telephone receiver 19, or some other indicating device may be properly connected with the current. When the resonator is connected in parallel with the coil 20 in the first circuit and the frequency of the alternating current is varied through the critical value, the sudden reaction of the resonator upon the current in 20 produces an audible click in the telephone 19. It is not generally necesary that the circuit of coil 17 should be in exact tune with that containing 20.

Fig. 6 illustrates the same plan as the preceding figure, but, in this case, the piezo-electric resonator is in parallel with the condenser 10 in the receiving circuit, instead of being in parallel with coil 20.

The operation is the same as described in connection with Fig. 5, except that the crystal reacts upon the receiving circuit, comprising the coil 17 and the condenser 10, as well as upon the circuit comprising the coil 20. This connection of the resonator in parallel with the capacity in a secondary circuit is found, in practice to be the best, whether the circuit is used for the standardizing of frequency or as a filter. The tuning condenser in parallel with the crystal and the resistance of the circuit should have as low values as possible.

Figure 7:
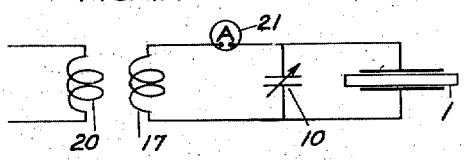

Fig. 7 is similar to Figs. 5 and 6, except, that, instead of the detector and the telephone, there is shown a high-frequency ammeter 21. By varying the frequency of the current in coil 20, and keeping the secondary circuit, which comprises the coil 17 and a variable condenser 10, in electrical resonance with the current in 20, it is possible to observe quantitatively the manner in which the current in the ammeter passes through a minimum at the critical frequency, and to determine the settings of condensers and other instruments corresponding to this frequency, with a high degree of precision.

For many purposes, it is immaterial whether the crystal is in the oscillatory circuit comprising the coil 20, as shown in Fig. 5, or in the circuit comprising the coil 17, as in Figs. 6 and 7. When the highest precision is sought, however, it is better to include the crystal in a different circuit from that which it is desired to standardize. With the crystal connected as in Fig. 5 or 6, the operation of tuning the generating circuit comprising the coil 20, so as to bring it into synchronism with the natural frequency of the resonator, is as follows: When the frequency of the current in the coil 20 passes through the critical value, the crystal is set into vibration, and it continues vibrating for a fraction of a second even after the frequency of the impressed alternating current has assumed a different value. The crystal, by its vibrations, generates a piezo-electromotive force, and two frequencies are then present in the secondary circuit:—one, that of the impressed alternating current as determined by the electrical constants of the circuit; and the other, that of the generating crystal. If the frequencies of these two currents are near each other, they may differ, say, to the extent of a few hundred cycles, the currents will combine, according to the heterodyne principle, to produce a beat-note of musical quality, which may be detected in the telephone receiver 19 as the before-mentioned click. The pitch and duration of the beat note depend upon the extent to which the condenser 10 is varied after the resonator has been set into vibration, and also upon the rate at which the vibrations of the resonator die away. If this rate is very rapid, then, on varying the condenser 10 through the critical value, only a short click, instead of a beat note of recognizable pitch, will be heard. This phenomenon is described in my paper above-mentioned, particularly page 109.

When the resonator is used as a frequency standard, connected to a secondary circuit as in Figs. 4, 6, or 7, the indicating device is, as a rule, either a current-measuring device in the main circuit, like the ammeter in Figs. 4 and 7, or else a potential-operated device, like the detector and telephone receiver in Fig. 6. In either case, the current flowing through the indicating device sinks to a simple minimum at the natural frequency of the resonator. These facts are explained more at length in my said paper, particularly in connection with Fig. 5 of that paper and on page 101.

Fig. 8 represents a form of circuit in common use for generating high-frequency currents by means of a three-element vacuum tube 22. In this figure 23 and 24 represent, respectively, the battery and the regulating resistance in the filament circuit; and 25 is the plate battery. A telephone receiver 19 has a fixed capacity 27 in parallel with it and 26 is the feedback coil, which is coupled to coil 28 in the grid circuit. Condenser 10, in parallel with coil 28, is used to control the frequency. The piezo-electric resonator is in parallel with the condenser 10 and its capacity is so small as not to introduce a perceptible error.

Currents of varying frequency may be obtained by varying the capacity of the condenser 10. Whenever the frequency passes through the natural frequency of vibration of the resonator, the latter is set into vibration. As long as these vibrations continue, there will be two frequencies present in the system; one due to the electrical tuning, as determined by the setting of the condenser 10, and the other due to the vibration of the resonator. The two frequencies will, as before described, cause a beat note to be heard in the receiver 19. In many cases, moreover, it is possible to detect the resonant frequency with a very loose coupling of the resonator, as when only one side of the resonator is connected, or even when both sides are disconnected as above described. In such cases, of course, the crystal is nevertheless connected with the circuit through the minute capacities between the resonator terminals and adjacent portions of the circuit.

In the description and illustrations given above, I have assumed that a supply of undamped alternating current was available. While the best results are obtained in this way, it is possible to use the resonator as a standard of wave length also when damped waves only are available, as, for example, from a buzzer circuit. The reaction is then much less pronounced, owing to the fact that a damped train of waves contains, not a single frequency, but a combination of many frequencies. If, however, damped waves must be used, it is best to make the decrement as small as possible, for example, by the use of impact excitation. Some of the circuits above described, as for example, the circuits shown in Figs. 3 and 6, or proper modifications of them, may then be employed.

From the nature of the invention thus above described certain modifications are obviously possible. For example, to secure piezo-electric resonators of various frequencies, weights may be attached to one or both ends of a piezo-electric plate, which will have the effect of lowering the frequency.

I have referred above to overtone frequencies, but in this connection little need be added. While the fundamental frequency of the plate or rod will usually give the strongest reaction, the various overtone vibrations can also be employed, giving reactions at frequencies approximately two, three or more times the fundamental. Or, if the plate has other dimensions comparable with its length, or if some other shape than that of a plate is used some other mode of vibration, giving a still different frequency, may be utilized. When the vibrating unit has once been suitably prepared and mounted, its resonant frequencies are, to a high degree of precision, fixed for all time.

What I claim as my invention is:

1. The combination with an alternating-current circuit of high frequency, of a means for reducing the flow of current therein at any particular frequency comprising a body of piezo-electric character with conductive coatings over the regions thereof which exhibit opposite electrification, and connected with the alternating-current circuit, the said body being so designed that its natural frequency of vibration will be in mechanical resonance with the said particular frequency of the alternating current.

2. The combination with an alternating-current circuit of high frequency, of a means for reducing the flow of current therein at any particular frequency, comprising a body of piezo-electric character with conductive coatings over the regions thereof which exhibit opposite electrification and connected with alternating-current circuit, the said body being so designed and mounted that its mechanical vibrations will be damped to the least possible extent and so that its natural frequency of vibration will be in mechanical resonance with the said particular frequency of the alternating current.

3. The combination with a tuned alternating-current circuit, of a means for reducing the flow of current therein at any particular frequency with which the circuit is in electrical resonance, comprising a body of piezo-electric character with conductive coatings over the regions thereof which exhibit opposite electrification, and connected in parallel with the capacity or inductance of said alternating-current circuit, the said body being so designed that its natural frequency of vibration will be in mechanical resonance with the said particular frequency of the alternating current.

4. The combination with a tuned alternating-current circuit, of a means for reducing the flow of current therein at any particular frequency with which the circuit is in electrical resonance, comprising a body of piezo-electric character with conductive coatings over the regions thereof which exhibit opposite electrification and connected in parallel with the capacity or inductance of said alternating-current circuit, the said body being so designed and mounted that its mechanical vibrations will be damped to the least possible extent and so that its natural frequency of vibration will be in mechanical resonance with the said particular frequency of the alternating current.

5. An alternating-current system comprising a receiving circuit in which currents of variable frequency are adapted to be received, and a piezo-electric body, the body being connected with the receiving circuit and so designed that a natural frequency of mechanical vibration of the body shall be substantially equal to a predetermined frequency of the current flowing in the receiving circuit.

6. An alternating-current system comprising a receiving circuit in which currents of variable frequency are adapted to be received, and a piezo-electric body connected with the receiving circuit and so designed that a natural frequency of mechanical vibration of the body shall be substantially equal to a predetermined frequency of the current flowing in the receiving circuit, the body being so mounted that its mechanical vibrations shall be damped to substantially the least possible extent.

7. An alternating-current receiving system comprising an alternating-current circuit and a piezo-electric body loosely coupled to the circuit.

8. An alternating-current system comprising an alternating-current circuit having a variable reactance, whereby the system may be tuned, a piezo-electric body, the body being connected in parallel with the reactance and being so designed that a natural frequency of mechanical vibration of the body shall be substantially equal to the frequency of the current.

9. An alternating-current system comprising an alternating-current circuit having a variable reactance, whereby the system may be tuned, a piezo-electric body connected in parallel with the reactance and being so designed that a natural frequency of mechanical vibration of the body shall be substantially equal to the frequency of the current, and the body being so mounted that its mechanical vibrations shall be damped to substantially the least possible extent.

10. An alternating-current system comprising an alternating-current circuit and a piezo-electric body adapted to vibrate both by reason of the transverse and the longitudinal effect.

In testimony whereof, I hereunto affix my signature.

WALTER G. CADY.